United States Patent
Wang et al.

(10) Patent No.: US 10,425,041 B2
(45) Date of Patent: Sep. 24, 2019

(54) DIFFERENTIAL TRANSIMPEDANCE AMPLIFIER

(71) Applicant: LITE-ON SINGAPORE PTE. LTD., Midview (SG)

(72) Inventors: You-Fa Wang, Singapore (SG); Meng-Tong Tan, Midview (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 16/045,282

(22) Filed: Jul. 25, 2018

(65) Prior Publication Data

US 2019/0181806 A1 Jun. 13, 2019

(30) Foreign Application Priority Data

Dec. 11, 2017 (CN) .......................... 2017 1 1308269

(51) Int. Cl.
*H03F 1/08* (2006.01)
*H03F 3/45* (2006.01)
*H03F 1/56* (2006.01)
*H03G 3/30* (2006.01)

(52) U.S. Cl.
CPC ............. *H03F 1/086* (2013.01); *H03F 1/56* (2013.01); *H03F 3/45179* (2013.01); *H03F 2200/541* (2013.01); *H03F 2203/45288* (2013.01)

(58) Field of Classification Search
USPC .................................................. 330/252–261
See application file for complete search history.

(56) References Cited

U.S. PATENT DOCUMENTS 7,746,172 B1 * 6/2010 Kobayashi .............. H03F 1/083
330/260
9,374,172 B2 * 6/2016 Suzuki ............... H04B 10/6931

* cited by examiner

*Primary Examiner* — Hieu P Nguyen
(74) *Attorney, Agent, or Firm* — Li & Cai Intellectual Property (USA) Office

(57) ABSTRACT

Disclosed is a differential transimpedance amplifier (TIA). In the differential TIA, an input end of the first source follower is coupled to the first output end of a first differential amplification circuit. The output end of the first source follower is coupled to the second input end of a second differential amplification circuit with feedback and a first feedback resistor. The input end of a second source follower is coupled to the second output end of the first differential amplification circuit. The output end of the second source follower is coupled to the first input end of the second differential amplification circuit with feedback and a second feedback resistor. A photo diode and a dummy diode are coupled respectively to two input ends of the first differential amplification circuit.

10 Claims, 4 Drawing Sheets

DIFFERENTIAL TRANSIMPEDANCE AMPLIFIER

BACKGROUND OF THE INVENTION

1. Field of the Invention

The present disclosure relates to a transimpedance amplifier (TIA) used in optical couplers; in particular, to a TIA having a differential structure.

2. Description of Related Art

The transimpedance amplifier (TIA) is widely used in optical communication. In an optical coupler, a photo diode receives a light signal emitted by a light source and converts the light signal into an output voltage signal of the optical coupler. The photocurrent generated by the photo diode is relevant to the driving current of the light source. For example, the light source of the optical coupler can be a light emitting diode (LED) or a laser. In practice, sometimes a smaller driving current of the light source is needed for certain applications. For a single-end TIA, the smaller the driving current of the light source is, the smaller the photocurrent generated by the photo diode will be. In this case, a larger gain of the TIA is required. However, when the gain of the TIA is increased, there will be more common-mode noises contained in the output voltage signal. As a result, it is hard for the output voltage signal to satisfy the common-mode rejection requirement (CMR Requirement).

Considering the chance that the driving current of the light source may be small, the TIAs often used in optical communication mainly include three types: the TIAs using operational amplifiers, the TIAs using common-source amplifiers, and the pseudo-differential TIAs using two single-end TIAs. Compared with the above three types of TIAs, the TIAs having a differential structure would be better in circumstances where the driving current of the light source is small, because the TIAs having a differential structure can simultaneously have a large gain and a high circuit operation speed, and its output voltage signal can easily satisfy the CMR Requirement. Nevertheless, the design and manufacture of the TIAs having a differential structure is still difficult.

SUMMARY OF THE INVENTION

The present disclosure provides a differential transimpedance amplifier (TIA). The differential TIA can amplify and convert a photocurrent generated by a photo diode and a current noise generated by a dummy diode respectively into a positive voltage signal and a negative voltage signal. By subtracting the negative voltage signal from the positive voltage signal, the common-mode noises can be suppressed or even eliminated. The differential TIA provided by the present disclosure includes a first differential amplification circuit, a second differential amplification circuit with feedback, a first source follower, a second source follower, a first feedback resistor, a second feedback resistor, a photo diode and a dummy diode. The first source follower has an input end and an output end. The input end of the first source follower is coupled to the first output end of the first differential amplification circuit, and the output end of the first source follower is coupled to the second input end of the second differential amplification circuit with feedback. The second source follower has an input end and an output end. The input end of the second source follower is coupled to the second output end of the first differential amplification circuit, and the output end of the second source follower is coupled to the first input end of the second differential amplification circuit with feedback. The output end of the first source follower is coupled to the first input end of the first differential amplification circuit through the first feedback resistor. The output end of the second source follower is coupled to the second input end of the first differential amplification circuit through the second feedback resistor. A third feedback resistor is coupled between the first input end and the first output end of the second differential amplification circuit with feedback. A fourth feedback resistor is coupled between the second input end and the second output end of the second differential amplification circuit with feedback. The anode of the photo diode is grounded, and the cathode of the photo diode and the second feedback resistor are together coupled to the second input end of the first differential amplification circuit. The anode of the dummy diode is grounded, and the cathode of the dummy diode and the first feedback resistor are together coupled to the first input end of the first differential amplification circuit.

The present disclosure provides another differential TIA. The differential TIA can also amplify and convert a photocurrent generated by a photo diode and a current noise generated by a dummy diode respectively into a positive voltage signal and a negative voltage signal. By subtracting the negative voltage signal from the positive voltage signal, the common-mode noises can be suppressed or even eliminated. The differential TIA provided by the present disclosure includes a first differential amplification circuit, a second differential amplification circuit with feedback, a first source follower and a second source follower. The first source follower has an input end and an output end. The input end of the first source follower is coupled to the first output end of the first differential amplification circuit, and the output end of the first source follower is coupled to the second input end of the second differential amplification circuit with feedback. The second source follower has an input end and an output end. The input end of the second source follower is coupled to the second output end of the first differential amplification circuit, and the output end of the second source follower is coupled to the first input end of the second differential amplification circuit with feedback. The output end of the first source follower is coupled to the first input end of the first differential amplification circuit through a first feedback resistor, and the output end of the second source follower is coupled to the second input end of the first differential amplification circuit through a second feedback resistor. A first load transistor is coupled to the first output end of the second differential amplification circuit with feedback, and a second load transistor is coupled to the second output end of the second differential amplification circuit with feedback. The anode of the photo diode is grounded, and the cathode of the photo diode and the second feedback resistor are together coupled to the second input end of the first differential amplification circuit. The anode of the dummy diode is grounded, and the cathode of the dummy diode and the first feedback resistor are together coupled to the first input end of the first differential amplification circuit.

The differential TIA provided by the present disclosure is designed based on a differential structure, which helps to suppress or even eliminate the common-mode noises and provide a high circuit operation speed and a large gain. Moreover, except for the feedback resistors, the circuit elements used in the present disclosure are mostly transistors. Compared with other kinds of circuit elements, the transistors have less manufacturing variation and higher matching, which helps the differential TIA operate within a wider range of work voltage.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

One Embodiment of the Differential TIA

The working principle of the differential transimpedance amplifier (TIA) provided by this embodiment is as follows. The differential TIA receives a current signal generated by a photo diode and a current noise generated by a dummy diode. Then, due to the differential structure of the differential TIA, the current signal generated by the photo diode and the current noise generated by the dummy diode are amplified and converted respectively into a positive voltage signal and a negative voltage signal. Finally, an output voltage signal having less common-mode noises or having no common-mode noises can be generated according to the positive voltage signal and the negative voltage signal. In brief, the differential TIA in this embodiment can suppress or even eliminate the common-mode noises.

Figure 1:
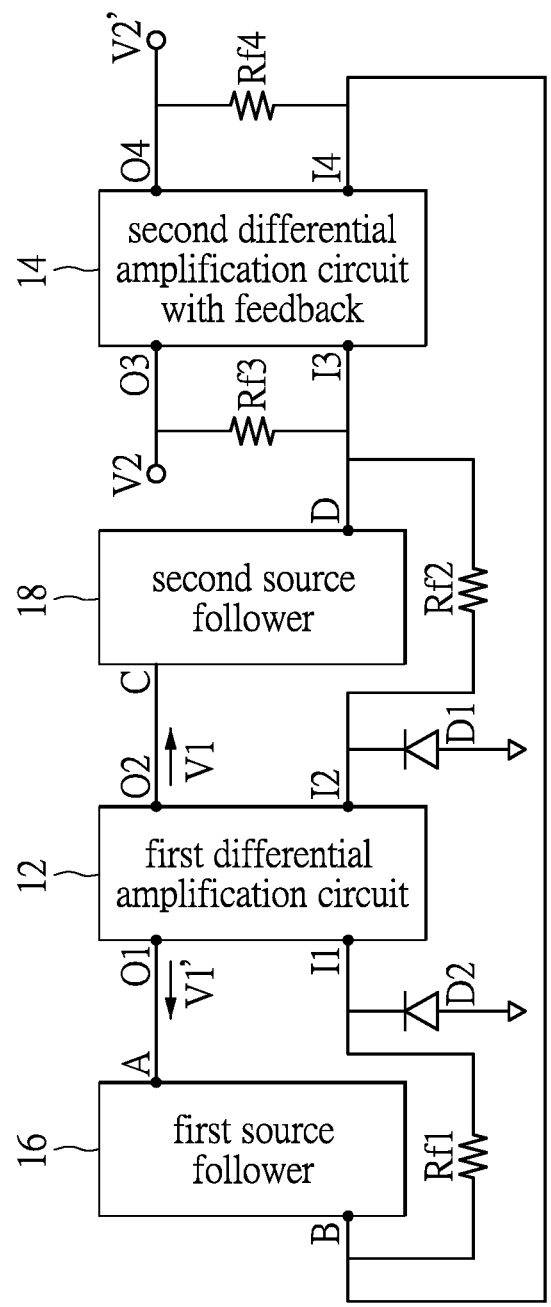
FIG. 1 shows a block diagram of a differential transimpedance amplifier (TIA) according to one embodiment of the present disclosure.

Referring to FIG. 1, a block diagram of a differential TIA according to one embodiment of the present disclosure is shown.

As shown in FIG. 1, the differential TIA in this embodiment includes a first differential amplification circuit 12, a second differential amplification circuit with feedback 14, a first source follower 16, a second source follower 18, feedback resistors Rf1, Rf2, Rf3 and Rf4, a photo diode D1 and a dummy diode D2.

The first differential amplification circuit 12 receives a current signal generated by the photo diode D1 and a current noise generated by the dummy diode D2. Then, the first differential amplification circuit 12 amplifies and converts the current signal and the current noise into voltage signals. The current signal is converted into a voltage signal, and this voltage signal is inputted to the second differential amplification circuit with feedback 14 through the second source follower 18. At the same time, the current noise is also converted into a voltage signal, and this voltage signal is inputted to the second differential amplification circuit with feedback 14 through the first source follower 16. When receiving these two voltage signals, the second differential amplification circuit with feedback 14 amplifies these two voltage signals and then outputs a positive voltage signal and a negative signal.

According to FIG. 1, the first differential amplification circuit 12 has a first input end I1, a second input end I2, a first output end O1 and a second output end O2. The second differential amplification circuit with feedback 14 has a first input end I3, a second input end I4, a first output end O3 and a second output end O4. The first source follower 16 has an input end A and an output end B, and the second source follower 18 has an input end C and an output end D. The input end A of the first source follower 16 is coupled to the first output end O1 of the first differential amplification circuit 12, and the output end B of the first source follower 16 is coupled to the second input end I4 of the second differential amplification circuit with feedback 14. The input end C of the second source follower 18 is coupled to the second output end O2 of the first differential amplification circuit 12, and the output end D of the second source follower 18 is coupled to the first input end I3 of the second differential amplification circuit with feedback 14.

The output end B of the first source follower is coupled to the first input end I1 of the first differential amplification circuit 12 through a first feedback resistor Rf1. The output end D of the second source follower 18 is coupled to the second input end I2 of the first differential amplification circuit 12 through a second feedback resistor Rf2. A third feedback resistor Rf3 is coupled between the first input end I3 and the first output end O3 of the second differential amplification circuit with feedback 14, and a fourth feedback resistor Rf4 is coupled between the second input end I4 and the second output end O4 of the second differential amplification circuit with feedback 14.

The following descriptions are for illustrating the working principle of the differential TIA.

In this embodiment, the first input end I1 of the first differential amplification circuit 12 is configured to receive a current noise generated by a dummy diode D2, and the second input end I2 of the first differential amplification circuit 12 is configured to receive a current signal generated by a photo diode D1. The cathode of the dummy diode D2 is coupled to the first input end I1 of the first differential amplification circuit 12, and the anode of the dummy diode D2 is grounded. The cathode of the photo diode D1 is coupled to the second input end I2 of the first differential amplification circuit 12, and the anode of the photo diode D1 is grounded.

It should be noted that, in this embodiment, the dummy diode D2 and the photo diode D1 are two diodes having the same size, but the dummy diode D2 has a light shielding layer. Thus, compared with the current signal generated by the photo diode D1, the current noise generated by the dummy diode D2 contains no light signal, but noises which the current signal generated by the photo diode D1 also contains.

Figure 2:
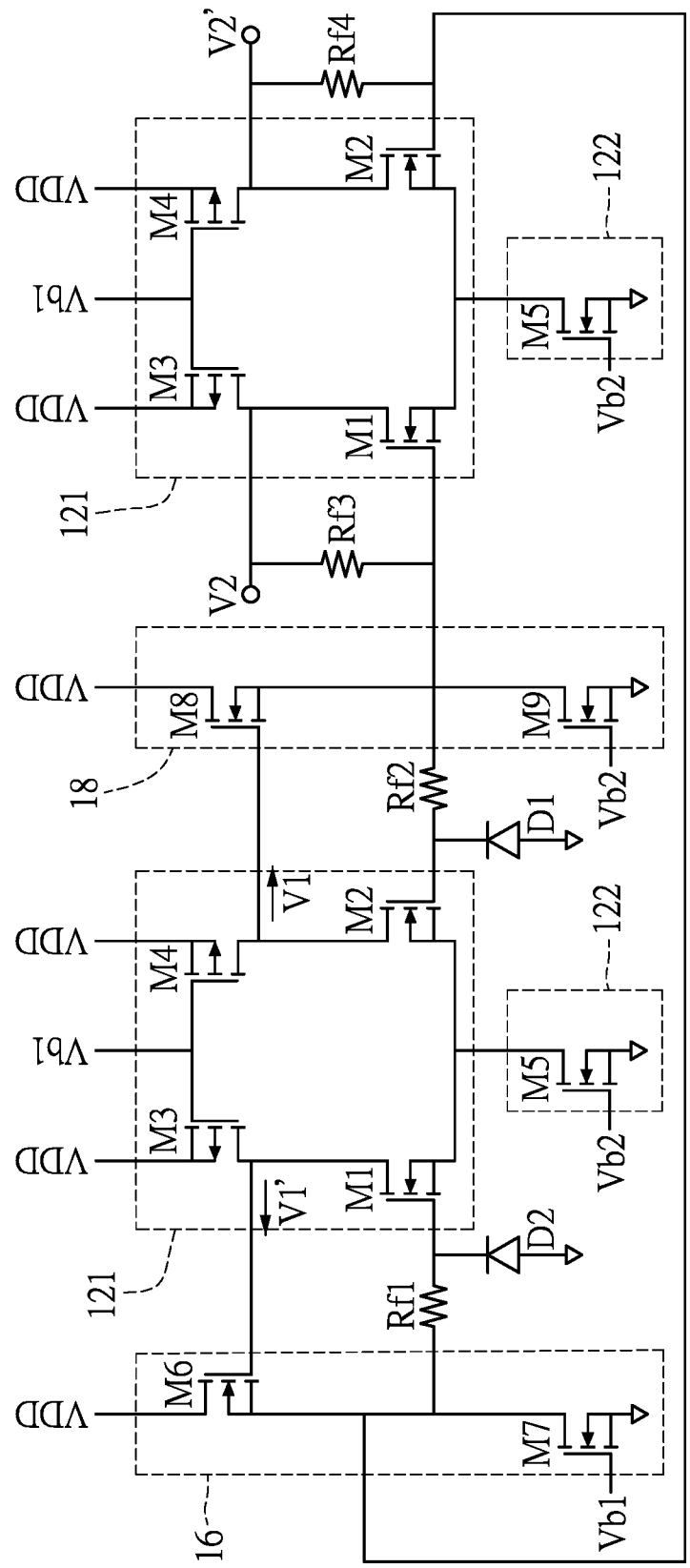
FIG. 2 shows a circuit diagram of a differential TIA shown in FIG. 1.

FIG. 2 shows a circuit diagram of a differential TIA shown in FIG. 1. As shown in FIG. 1 and FIG. 2, the first differential amplification circuit 12 includes a first differential pair 121 and a first current source 122.

The first differential pair 121 includes a first transistor M1, a second transistor M2, a third transistor M3 and a fourth transistor M4. The first end of the first transistor M1 and the first end of the second transistor M2 are coupled to a first current source 122. The second end of the first transistor M1 and the second end of the second transistor M2 are respectively the first input end I1 and the second input end I2 of the first differential amplification circuit 12. The third end of the first transistor M1 and the third end of the second transistor M2 are respectively the first output end O1 and the second output end O2 of the first differential amplification circuit 12. The first end of the third transistor M3 and the first end of the fourth transistor M4 receive a supply voltage VDD. The second end of the third transistor M3 and the second end of the fourth transistor M4 are coupled to a first bias source Vb1. The third end of the third transistor M3 is coupled to the third end of the first transistor M1, and the third end of the fourth transistor M4 is coupled to the third end of the second transistor M2.

For example, the first transistor M1 and the second transistor M2 are NMOS transistors, and the third transistor M3 and the fourth transistor M4 are PMOS transistors. In this example, the first ends of the first transistor M1, the second transistor M2, the third transistor M3 and the fourth transistor M4 are sources, the second ends of the first transistor M1, the second transistor M2, the third transistor M3 and the fourth transistor M4 are gates, and the third ends of the first transistor M1, the second transistor M2, the third transistor M3 and the fourth transistor M4 are drains.

In addition, the first current source 122 is the fifth transistor M5. The first end of the fifth transistor M5 is grounded, the second end of the fifth transistor M5 is coupled to a second bias source Vb2, and the third end of the fifth transistor M5 is coupled to the first differential pair 121. For example, the fifth transistor M5 is an NMOS transistor M5. In this example, the first end of the fifth transistor M5 is a source, the second end of the fifth transistor M5 is a gate, and the third end of the fifth transistor M5 is a drain.

After the current signal generated by the photo diode D1 and the current noise generated by the dummy diode D2 are amplified, a first positive voltage signal V1 and a first negative voltage signal V1' are generated. It should be noted that, the voltage values of the first positive voltage signal V1 and the first negative voltage signal V1' are relevant to the product of the current signal generated by the photo diode D1 and the resistance of the second feedback resistor Rf2. In this embodiment, the resistances of the first feedback resistor Rf1 and the second feedback resistor Rf2 are within 30 KΩ~100 KΩ.

After that, the first positive voltage signal V1 is transmitted from the second output end O2 of the first differential amplification circuit 12 to the input end C of the second source follower 18. At the same time, the first negative voltage signal V1' is transmitted from the first output end O1 of the first differential amplification circuit 12 to the input end A of the first source follower 16.

According to FIG. 2, the first source follower 16 includes a sixth transistor M6 and a seventh transistor M7. The first end of the sixth transistor M6 is the output end B of the first source follower 16, the second end of the sixth transistor M6 is grounded, and the third end of the sixth transistor M6 receives a supply voltage VDD. The first end of the seventh transistor M7 is grounded, the second end of the seventh transistor M7 is coupled to a second bias source Vb2, and the third end of the seventh transistor M7 is coupled to the first end of the sixth transistor M6.

The circuit configuration of the second source follower 18 is similar to the circuit configuration of the first source follower 16. The second source follower 18 includes an eighth transistor M8 and a ninth transistor M9. The first end of the eighth transistor M8 is the output end D of the second source follower 18, the second end of the eighth transistor M8 is coupled to the second output end O2 of the first differential amplification circuit 12, and the third end of the eighth transistor M8 receives a supply voltage VDD. The first end of the ninth transistor M9 is grounded, the second end of the ninth transistor M9 is coupled to a second bias source Vb2, and the third end of the ninth transistor M9 is coupled to the first end of the eighth transistor M8.

For example, the sixth transistor M6 and the seventh transistor M7 are NMOS transistors, and the eighth transistor M8 and the ninth transistor M9 are also NMOS transistors. In this example, the first ends of the sixth transistor M6 and the seventh transistor M7 are sources, the second ends of the sixth transistor M6 and the seventh transistor M7 are gates, and the third ends of the sixth transistor M6 and the seventh transistor M7 are drains. Additionally, the first ends of the eighth transistor M8 and the ninth transistor M9 are sources, the second ends of the eighth transistor M8 and the ninth transistor M9 are gates, and the third ends of the eighth transistor M8 and the ninth transistor M9 are drains.

After the first positive voltage signal V1 is received by the input end C of the second source follower 18, the first positive voltage signal V1 is then transmitted from the output end D of the second source follower 18 to the first input end I3 of the second differential amplification circuit with feedback 14. At the same time, after the first negative voltage signal V1' is received by the input end A of the first source follower 16, the first negative voltage signal V1' is then transmitted from the output end B of the first source follower 16 to the second input end I4 of the second differential amplification circuit with feedback 14.

Generally, to have a large gain, a differential TIA using operational amplifier needs a Miller compensation circuit for maintaining circuit stability. However, in this way, the circuit operation speed is traded off for the circuit stability. Specifically, when the Miller compensation circuit works, the circuit stability is obtained by the splitting of poles (i.e., the dominate pole of the differential TIA is dropped to a lower frequency, and the secondary pole of the differential TIA is raised to a higher frequency). Thus, for the differential TIA using operational amplifiers, the Miller compensation circuit helps to increase the circuit stability, but the frequency difference between the dominate pole and the secondary pole of the differential TIA are split. As a result, the dominate pole of the differential TIA is dropped to a lower frequency so that the circuit operation speed decreases.

However, the differential TIA provided by this embodiment is free from the above drawback. In this embodiment, the first source follower 16 and the second source follower 18 are both voltage followers and have small output impedances. Even without a Miller compensation circuit, the dominate pole of the differential TIA can be raised to a higher frequency, and the secondary pole of the differential TIA can be raised to a much higher frequency, which enhances the circuit stability. Thus, even with no Miller compensation circuit, the differential TIA in this embodiment can still have both the large gain and the greater circuit stability, and can retain a small bandwidth between its dominate pole and its secondary pole to maintain the circuit operation speed. Furthermore, the differential TIA in this embodiment has a large gain and is designed based on a differential structure, so that a lower current signal can be detected by virtue of a high data rate. For example, the data rate of the differential TIA in this embodiment can be larger than or equal to 1 MB.

In this embodiment, the first differential amplification circuit 12 and the second differential amplification circuit with feedback 14 can be designed based on the same circuit configuration. In other words, the sizes of circuit elements in the first differential amplification circuit 12 are equal to the sizes of circuit elements in the second differential amplification circuit with feedback 14. Also, the bias sources used in the first differential amplification circuit 12 and the bias sources used in the second differential amplification circuit with feedback 14 are the same.

After the first positive voltage signal V1 and the first negative voltage signal V1' are received respectively by the first input end I3 and the second input end I4 of the second differential amplification circuit with feedback 14, the first positive voltage signal V1 and the first negative voltage signal V1' are amplified. Then, according to the amplified first positive voltage signal V1 and the amplified first negative voltage signal V1', a second positive voltage signal V2 and a second negative voltage signal V2' are outputted respectively from the first output end O3 and the second output end Q4 of the second differential amplification circuit with feedback 14. It should be noted that, the voltage values of the second positive voltage signal V2 and the second negative voltage signal V2' are relevant to the third feedback resistor Rf3 and the fourth feedback resistor Rf4. In other words, for the second differential amplification circuit with feedback 14, its gain is relevant to the resistances of the third feedback resistor Rf3 and the fourth feedback resistor Rf4. In this embodiment, the resistances of the third feedback resistor Rf3 and the fourth feedback resistor Rf4 are larger than 10 KΩ.

The differential TIA in this embodiment further includes a comparator (not shown). The first output end O3 and the second output end O4 of the second differential amplification circuit with feedback 14 are coupled respectively to the inverting input end and the non-inverting input end of the comparator. The comparator receives and compares the second positive voltage signal V2 and the second negative voltage signal V2' to generate an output voltage signal. The noises contained in the second positive voltage signal V2 and the noises contained in the second negative voltage signal V2' can be mutually cancelled by comparing the second positive voltage signal V2 and the second negative voltage signal V2', and thus the common-mode noises can be suppressed or even eliminated. In this manner, the noises in the current noise generated by the dummy diode D2 will not affect the output voltage signal.

It is worth mentioning that, the photo diode D1 and the dummy diode D2 are designed to be self-biasing. In this design, a 2~3.5V reverse bias voltage is applied to the photo diode D1 and the dummy diode D2 for decreasing the capacitances of the photo diode D1 and the dummy diode D2 and further for increasing the circuit operation speed. It should be noted that, the reverse bias voltage applied to the photo diode D1 and the dummy diode D2 is relevant to the supply voltage VDD of the differential TIA.

Moreover, except for the feedback resistors, the circuit elements used in the differential TIA in this embodiment are mostly transistors. Compared with other kinds of circuit elements, the transistors have less manufacturing variation and high matching, which helps the differential TIA operate within a wider range of work voltage.

Another Embodiment of the Differential TIA

Figure 3:
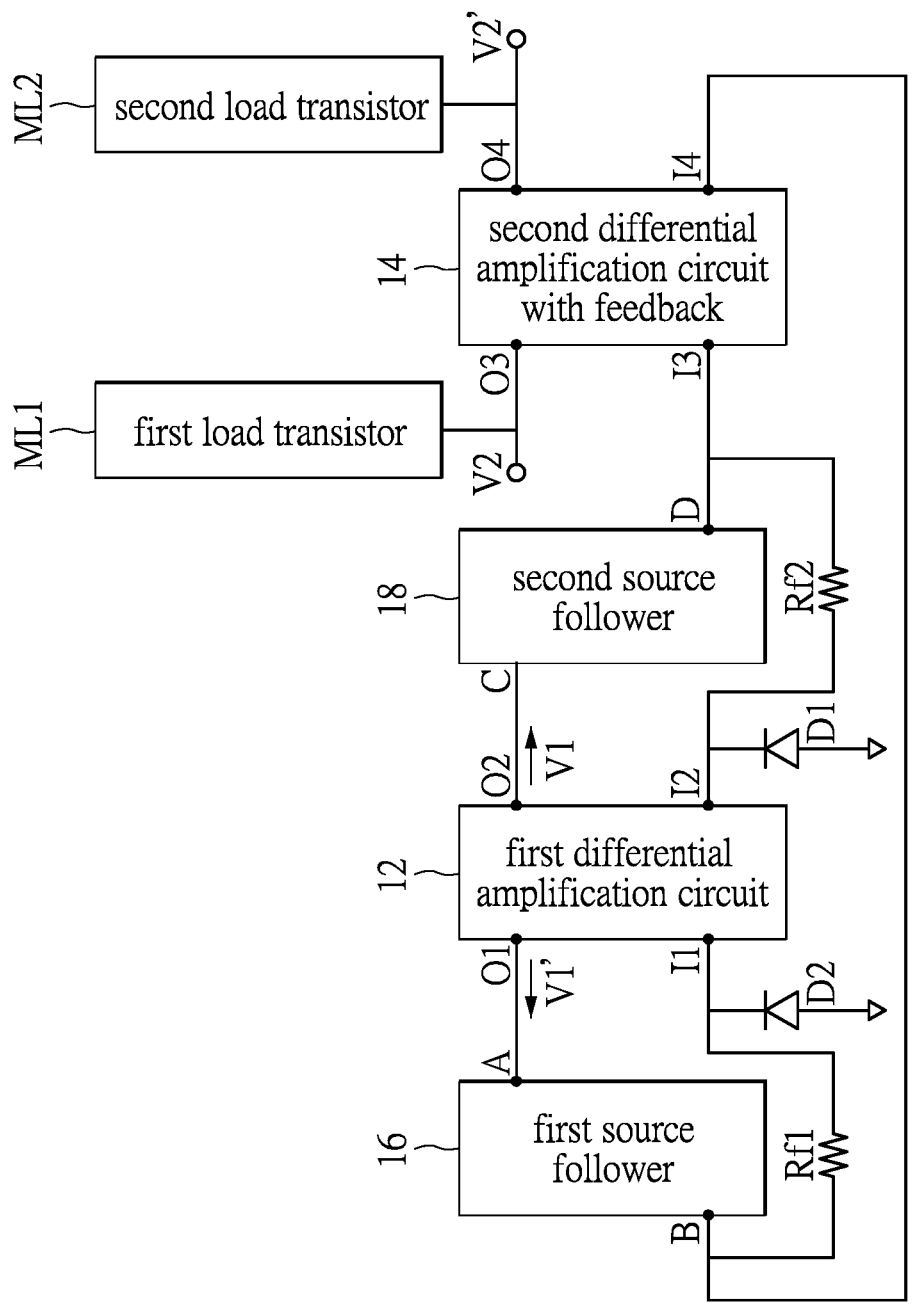
FIG. 3 shows a block diagram of a differential TIA according to another embodiment of the present disclosure.

Referring to FIG. 3, a block diagram of a differential TIA according to another embodiment of the present disclosure is shown. The circuit structure and the working principle of the differential TIA in this embodiment are similar to the circuit structure and the working principle of the differential TIA in the previous embodiment. Thus, in the following descriptions, only differences between them are described.

Figure 4:
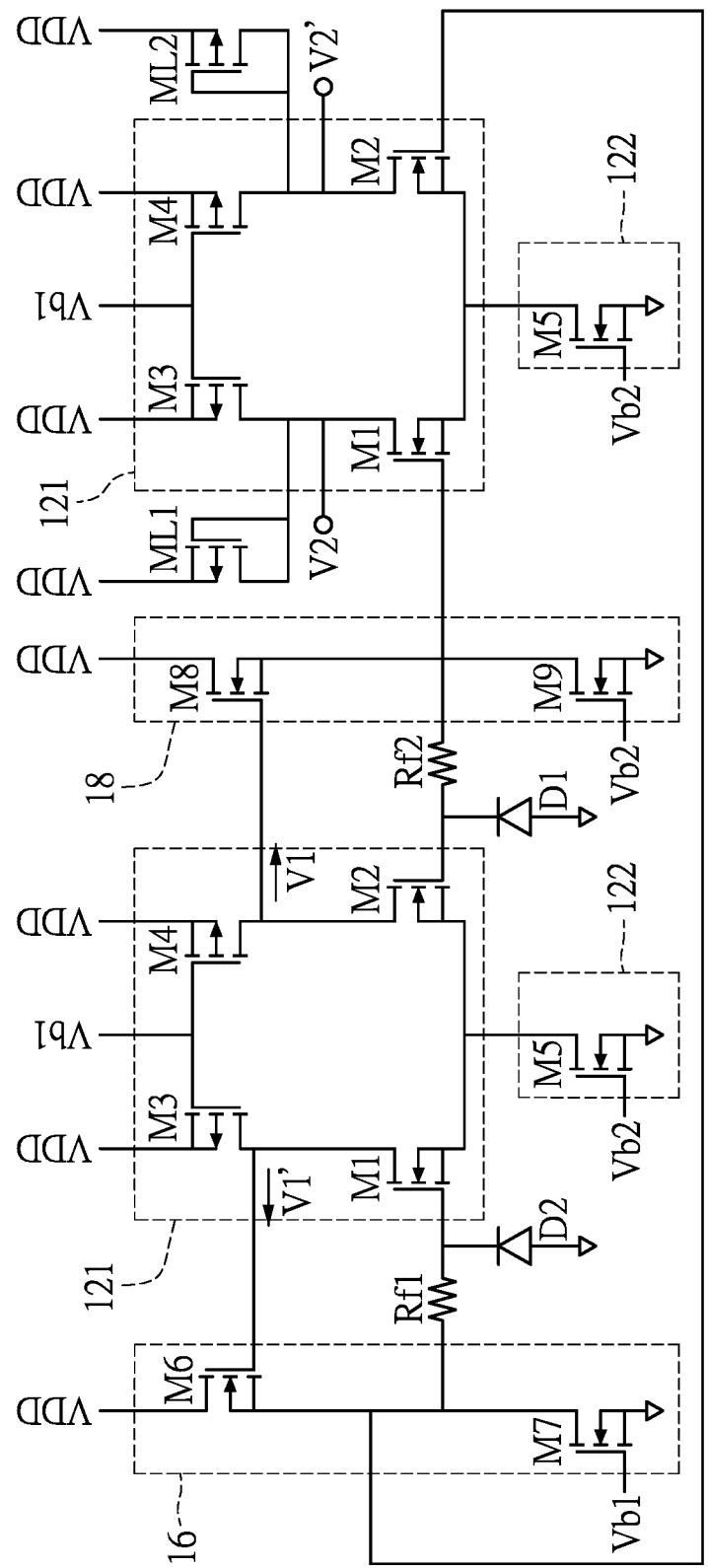
FIG. 4 shows a circuit diagram of the differential TIA shown in FIG. 3.

FIG. 4 shows a circuit diagram of the differential TIA shown in FIG. 3. The difference between the circuit structure of the differential TIA in this embodiment and the circuit structure of the differential TIA in the previous embodiment is that, as shown in FIG. 4, there is no third feedback resistor Rf3 between the first input end I3 and the first output end O3 of the second differential amplification circuit with feedback 14 and no fourth feedback resistor Rf4 between the second input end I4 and the second output end O4 of the second differential amplification circuit with feedback 14. Instead, a first load transistor ML1 is coupled to the first output end O3 of the second differential amplification circuit with feedback 14, and a second load transistor ML2 is coupled to the second output end O4 of the second differential amplification circuit with feedback 14. The first end of the first load transistor ML1 and the first end of the second load transistor ML2 receive a supply voltage VDD. The second end and the third end of the first load transistor ML1 are coupled to the first output end O3 of the second differential amplification circuit with feedback 14. The second end and the third end of the second load transistor ML2 are coupled to the second output end O4 of the second differential amplification circuit with feedback 14. For example, the first load transistor ML1 and the second load transistor ML2 are PMOS transistors. In this example, the first ends of the first load transistor ML1 and the second load transistor ML2 are sources, the second ends of the first load transistor ML1 and the second load transistor ML2 are gates, and the third ends of the first load transistor ML1 and the second load transistor ML2 are drains.

Basically, the working principle of the differential TIA in this embodiment and the working principle of the differential TIA in the previous embodiment are quite similar. However, due to the differences between their circuit structures, in this embodiment, the voltage values of the second positive voltage signal V2 and the second negative voltage signal V2' are relevant to the specifications of the first load transistor ML1 and the second load transistor ML2 and to the specifications of the third transistor M3 and the fourth transistor M4 of the second differential amplification circuit with feedback 14, but irrelevant to the resistances of the third feedback resistor Rf3 and the fourth feedback resistor Rf4.

In this embodiment, the first differential amplification circuit 12 and the second differential amplification circuit with feedback 14 have similar circuit structures, but the transistors in the first differential amplification circuit 12 and the transistors in the second differential amplification circuit with feedback 14 have different sizes. For example, in the first differential amplification circuit 12, the sizes of the third transistor M3 and the fourth transistor M4 are 2~3.5 times larger than the sizes of the first transistor M1, the second transistor M2 and the fifth transistor M5. Furthermore, in the second differential amplification circuit with feedback 14, the sizes of the third transistor M3 and the fourth transistor M4 are smaller than or equal to half of the sizes of the first transistor M1, the second transistor M2 and the fifth transistor M5. Due to this design, the differential transimpedance amplifier can have a gain precisely as required, and its circuit oscillation can be avoided so that its circuit stability can be enhanced.

Other details about the working principle of the differential TIA in this embodiment can be referred to in the descriptions of the previous embodiment, and thus are omitted herein.

To sum up, the differential TIA provided by the present disclosure has advantages as follows.

In the present disclosure, the photo diode and the dummy diode are designed to be self-biasing. Thus, the capacitances of the photo diode and the dummy diode can be decreased, which further increases the circuit operation speed.

In addition, except for the feedback resistors, the circuit elements used in the present disclosure are mostly transistors. Compared with other kinds of circuit elements, the transistors have less manufacturing variation and high matching, which helps the present disclosure operate within a wider range of work voltage.

Even without a Miller compensation circuit, the present disclosure can still have both a large gain and a greater circuit stability, and can retain a small bandwidth between its dominate pole and its secondary pole for maintaining the circuit operation speed.

Moreover, the present disclosure has a large gain and is designed based on a differential structure, so as to be capable of detecting a lower current signal due to its high data rate.

Most importantly, by using the differential transimpedance amplifier of the present disclosure, the noises contained in the positive voltage signal and the noises contained in the negative voltage signal can be mutually cancelled, and thus the common-mode noises can be suppressed or even eliminated. As a result, an output voltage signal of the present disclosure satisfies the common-mode rejection requirement (CMR Requirement) even when the driving current of a light source is small.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A differential transimpedance amplifier, amplifying and converting a current generated by a photo diode and a current noise generated by a dummy diode respectively into a positive voltage signal and a negative voltage signal, comprising:
 a first differential amplification circuit, having a first input end, a second input end, a first output end and a second output end;
 a second differential amplification circuit with feedback, having a first input end, a second input end, a first output end and a second output end;
 a first source follower, having an input end and an output end, wherein the input end of the first source follower is coupled to the first output end of the first differential amplification circuit, and the output end of the first source follower is coupled to the second input end of the second differential amplification circuit with feedback; and
 a second source follower, having an input end and an output end, wherein the input end of the second source follower is coupled to the second output end of the first differential amplification circuit, and the output end of the second source follower is coupled to the first input end of the second differential amplification circuit with feedback;
 wherein the output end of the first source follower is coupled to the first input end of the first differential amplification circuit through a first feedback resistor, the output end of the second source follower is coupled to the second input end of the first differential amplification circuit through a second feedback resistor, a third feedback resistor is coupled between the first input end and the first output end of the second differential amplification circuit with feedback, and a fourth feedback resistor is coupled between the second input end and the second output end of the second differential amplification circuit with feedback.

2. The differential transimpedance amplifier according to claim 1,
 wherein the first input end of the first differential amplification circuit is configured to receive the current noise generated by the dummy diode, and the second input end of the first differential amplification circuit is configured to receive the current signal generated by the photo diode;
 wherein the size of the dummy diode equals to the size of the photo diode;
 wherein the cathode of the dummy diode is coupled to the first input end of the first differential amplification circuit, the anode of the dummy diode is grounded, the cathode of the photo diode is coupled to the second input end of the first differential amplification circuit, and the anode of the photo diode is grounded;
 wherein the first differential amplification circuit includes:
  a first differential pair, including:
   a first transistor and a second transistor, wherein the first end of the first transistor and the first end of the second transistor are coupled to the first current source, the second end of the first transistor and the second end of the second transistor are respectively the first input end and the second input end of the first differential amplification circuit, and the third end of the first transistor and the third end of the second transistor are respectively the first output end and the second output end of the first differential amplification circuit; and
   a third transistor and a fourth transistor, wherein the first end of the third transistor and the first end of the fourth transistor receive a supply voltage, the second end of the third transistor and the second end of the fourth transistor are coupled to a first bias source, the third end of the third transistor is coupled to the third end of the first transistor, and the third end of the fourth transistor is coupled to the third end of the second transistor; and
  a first current source, including:
   a fifth transistor, wherein the first end of the fifth transistor is grounded, the second end of the fifth transistor is coupled to a second bias source, and the third end of the fifth transistor is coupled to the first differential pair.

3. The differential transimpedance amplifier according to claim 2, wherein in the first differential pair, the first transistor and the second transistor are NMOS transistors, the third transistor and the fourth transistor are PMOS transistors, the first ends of the first transistor, the second transistor, the third transistor and the fourth transistor are sources, the second ends of the first transistor, the second transistor, the third transistor and the fourth transistor are gates, and the third ends of the first transistor, the second transistor, the third transistor and the fourth transistor are drains.

4. The differential transimpedance amplifier according to claim 1,
wherein the first source follower includes:
a sixth transistor, wherein the first end of the sixth transistor is the output end of the first source follower, the second of the sixth transistor is grounded, and the third end of the sixth transistor receives a supply voltage; and
a seventh transistor, wherein the first end of the seventh transistor is grounded, the second end of the seventh transistor is coupled to a second bias source, and the third end of the seventh transistor is coupled to the first end of the sixth transistor;
wherein the sixth transistor and the seventh transistor are NMOS transistors, the first ends of the sixth transistor and the seventh transistor are sources, the second ends of the sixth transistor and the seventh transistor are gates, and the third ends of the sixth transistor and the seventh transistor are drains;
wherein the second source follower includes:
an eighth transistor, wherein the first end of the eighth transistor is the output end of the second source follower, the second end of the eighth transistor is coupled to the second output end of the first differential amplification circuit, and the third end of the eighth transistor receives a supply voltage; and
a ninth transistor, wherein the first end of the ninth transistor is grounded, the second end of the ninth transistor is coupled to the second bias source, and the third end of the ninth transistor is coupled to the first end of the eighth transistor;
wherein the eighth transistor and the ninth transistor are NMOS transistors, the first ends of the eighth transistor and the ninth transistor are sources, the second ends of the eighth transistor and the ninth transistor are gates, and the third ends of the eighth transistor and the ninth transistor are drains.

5. The differential transimpedance amplifier according to claim 1, further comprising:
a comparator, wherein the first output end and the second output end of the second differential amplification circuit with feedback are coupled respectively to the inverting input end and the non-inverting input end of the comparator, such that the comparator compares the negative voltage signal and the positive voltage signal and accordingly generates an output voltage signal to suppress common-mode noises contained in the output voltage signal;
wherein the first differential amplification circuit and the second differential amplification circuit with feedback have the same circuit configuration, and the sizes of circuit elements in the first differential amplification circuit equal to the sizes of circuit elements in the second differential amplification circuit with feedback;
wherein the resistances of the first feedback resistor and the second feedback resistor are within 30 KΩ~100 KΩ;
wherein the resistances of the third feedback resistor and the fourth feedback resistor are larger than 10 KΩ.

6. A differential transimpedance amplifier, amplifying and converting a current generated by a photo diode and a current noise generated by a dummy diode respectively into a positive voltage signal and a negative voltage signal, comprising:
a first differential amplification circuit, having a first input end, a second input end, a first output end and a second output end;
a second differential amplification circuit with feedback, having a first input end, a second input end, a first output end and a second output end;
a first source follower, having an input end and an output end, wherein the input end of the first source follower is coupled to the first output end of the first differential amplification circuit, and the output end of the first source follower is coupled to the second input end of the second differential amplification circuit with feedback; and
a second source follower, having an input end and an output end, wherein the input end of the second source follower is coupled to the second output end of the first differential amplification circuit, and the output end of the second source follower is coupled to the first input end of the second differential amplification circuit with feedback;
wherein the output end of the first source follower is coupled to the first input end of the first differential amplification circuit through a first feedback resistor, the output end of the second source follower is coupled to the second input end of the first differential amplification circuit through a second feedback resistor, a first load transistor is coupled to the first output end of the second differential amplification circuit with feedback, and a second load transistor is coupled to the second output end of the second differential amplification circuit with feedback.

7. The differential transimpedance amplifier according to claim 6,
wherein the first end of the first load transistor and the first end of the second load transistor receive a supply voltage, the second end and the third end of the first load transistor are coupled to the first output end of the second differential amplification circuit with feedback, and the second end and the third end of the second load transistor are coupled to the second output end of the second differential amplification circuit with feedback;
wherein the first load transistor and the second load transistor are PMOS transistors, the first ends of the first load transistor and the second load transistor are sources, the second ends of the first load transistor and the second load transistor are gates, and the third ends of the first load transistor and the second load transistor are drains;
wherein the first input end of the first differential amplification circuit is configured to receive the current noise generated by the dummy diode, and the second input end of the first differential amplification circuit is configured to receive the current signal generated by the photo diode;

wherein the size of the dummy diode equals to the size of the photo diode;

wherein the cathode of the dummy diode is coupled to the first input end of the first differential amplification circuit, the anode of the dummy diode is grounded, the cathode of the photo diode is coupled to the second input end of the first differential amplification circuit, and the anode of the photo diode is grounded;

wherein the first differential amplification circuit includes:

a first differential pair, including:

a first transistor and a second transistor, wherein the first end of the first transistor and the first end of the second transistor are coupled to the first current source, the second end of the first transistor and the second end of the second transistor are respectively the first input end and the second input end of the first differential amplification circuit, and the third end of the first transistor and the third end of the second transistor are respectively the first output end and the second output end of the first differential amplification circuit; and a third transistor and a fourth transistor, wherein the first end of the third transistor and the first end of the fourth transistor receive a supply voltage, the second end of the third transistor and the second end of the fourth transistor is coupled to a first bias source, the third end of the third transistor is coupled to the third end of the first transistor, and the third end of the fourth transistor is coupled to the third end of the second transistor; and a first current source, including:

a fifth transistor, wherein the first end of the fifth transistor is grounded, the second end of the fifth transistor is coupled to a second bias source, and the third end of the fifth transistor is coupled to the first differential pair.

8. The differential transimpedance amplifier according to claim 7, wherein the first differential amplification circuit and the second differential amplification circuit with feedback have the same circuit configuration, in the first differential amplification circuit, the sizes of the third transistor and the fourth transistor are 2~3.5 times larger than the sizes of the first transistor, the second transistor and the fifth transistor, and in the second differential amplification circuit with feedback, the sizes of the third transistor and the fourth transistor are smaller than or equal to the half sizes of the first transistor, the second transistor and the fifth transistor.

9. The differential transimpedance amplifier according to claim 6, wherein the first source follower includes:

a sixth transistor, wherein the first end of the sixth transistor is the output end of the first source follower, the second end of the sixth transistor is grounded, and the third end of the sixth transistor receives a supply voltage; and a seventh transistor, wherein the first end of the seventh transistor is grounded, the second end of the seventh transistor is coupled to a second bias source, and the third end of the seventh transistor is coupled to the first end of the sixth transistor;

wherein the sixth transistor and the seventh transistor are NMOS transistors, the first ends of the sixth transistor and the seventh transistor are sources, the second ends of the sixth transistor and the seventh transistor are gates, and the third ends of the sixth transistor and the seventh transistor are drains;

wherein the second source follower includes:

an eighth transistor, wherein the first end of the eighth transistor is the output end of the second source follower, the second end of the eighth transistor is coupled to the second output end of the first differential amplification circuit, and the third end of the eighth transistor receives a supply voltage; and a ninth transistor, wherein the first end of the ninth transistor is grounded, the second end of the ninth transistor is coupled to the second bias source, and the third end of the ninth transistor is coupled o the first end of the eighth transistor;

wherein the eighth transistor and the ninth transistor are NMOS transistors, the first ends of the eighth transistor and the ninth transistor are sources, the second ends of the eighth transistor and the ninth transistor are gates, and the third ends of the eighth transistor and the ninth transistor are drains.

10. The differential transimpedance amplifier according to claim 6, further comprising:

a comparator, wherein the first output end and the second output end of the second differential amplification circuit with feedback are coupled respectively to the inverting input end and the non-inverting input end of the comparator, such that the comparator compares the negative voltage signal and the positive voltage signal and accordingly generates an output voltage signal.

* * * * *